(12) United States Patent
Nakano

(10) Patent No.: US 11,018,172 B2
(45) Date of Patent: May 25, 2021

(54) SOLID-STATE IMAGING ELEMENT, AND ELECTRONIC DEVICE

(71) Applicant: SONY CORPORATION, Tokyo (JP)

(72) Inventor: Takuya Nakano, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 71 days.

(21) Appl. No.: 15/316,918

(22) PCT Filed: Jun. 16, 2015

(86) PCT No.: PCT/JP2015/067229
§ 371 (c)(1),
(2) Date: Dec. 7, 2016

(87) PCT Pub. No.: WO2015/198908
PCT Pub. Date: Dec. 30, 2015

(65) Prior Publication Data
US 2017/0117313 A1 Apr. 27, 2017

(30) Foreign Application Priority Data
Jun. 27, 2014 (JP) .............................. JP2014-132762

(51) Int. Cl.
*H01L 27/146* (2006.01)
*H01L 27/14* (2006.01)
*H04N 5/361* (2011.01)

(52) U.S. Cl.
CPC ........ *H01L 27/14623* (2013.01); *H01L 27/14* (2013.01); *H01L 27/1464* (2013.01);
(Continued)

(58) Field of Classification Search
CPC ......... H01L 27/14623; H01L 27/14621; H01L 27/14605; H01L 27/1464; H01L 31/02162; H01L 31/02164; H01L 27/146–14893
See application file for complete search history.

(56) References Cited

U.S. PATENT DOCUMENTS

2010/0201834 A1* 8/2010 Maruyama .......... H01L 27/1464
348/222.1
2011/0267696 A1* 11/2011 Tsuji ...................... G02B 5/005
359/601
(Continued)

FOREIGN PATENT DOCUMENTS

JP 4-357818 A 12/1992
JP 4-872023 B1 2/2012
(Continued)

OTHER PUBLICATIONS

International Search Report and Written Opinion of PCT Application No. PCT/JP2015/067229, dated Aug. 11, 2015, 10 pages of English Translation and 9 pages of ISRWO.
(Continued)

*Primary Examiner* — Stephen W Smoot
*Assistant Examiner* — Sun Mi Kim King
(74) *Attorney, Agent, or Firm* — Chip Law Group

(57) ABSTRACT

The present disclosure relates to a solid-state imaging element configured to inhibit an adverse effect, which is attributable to a light shielding film formed for disposing an OPB region, on the formation of a constituent other than the light shielding film of the solid-state imaging element, and an electronic device. According to a first aspect of the present disclosure, there is provided a solid-state imaging element, including: an effective pixel region in which a large number of pixels are vertically and horizontally arranged; and an OPB region formed by coating pixels around the
(Continued)

effective pixel region with a light shielding film. Corners on at least one of an outer circumferential side and an inner circumferential side of the OPB region are formed into an arc shape. The present disclosure can be applied to, for example, a back-surface irradiation type CMOS image sensor.

8 Claims, 6 Drawing Sheets

(52) U.S. Cl.
CPC .. *H01L 27/14605* (2013.01); *H01L 27/14621* (2013.01); *H04N 5/361* (2013.01)

(56) References Cited

U.S. PATENT DOCUMENTS

2012/0147208 A1* 6/2012 Otsuka ............. H01L 27/14621
348/222.1
2012/0267744 A1 10/2012 Tsuji
2013/0249039 A1* 9/2013 Hsu ................... H01L 27/14623
257/435
2014/0002700 A1* 1/2014 Oishi ..................... H04N 5/369
348/273

FOREIGN PATENT DOCUMENTS

| | | |
|---|---|---|
| JP | 2012-049295 A | 3/2012 |
| JP | 2012-227474 A | 11/2012 |
| TW | 2014-44069 A | 11/2014 |
| WO | 2014/156657 A1 | 10/2014 |

OTHER PUBLICATIONS

International Preliminary Report on Patentability of PCT Application No. PCT/JP2015/067229, dated Dec. 27, 2016, pp. 7.

* cited by examiner

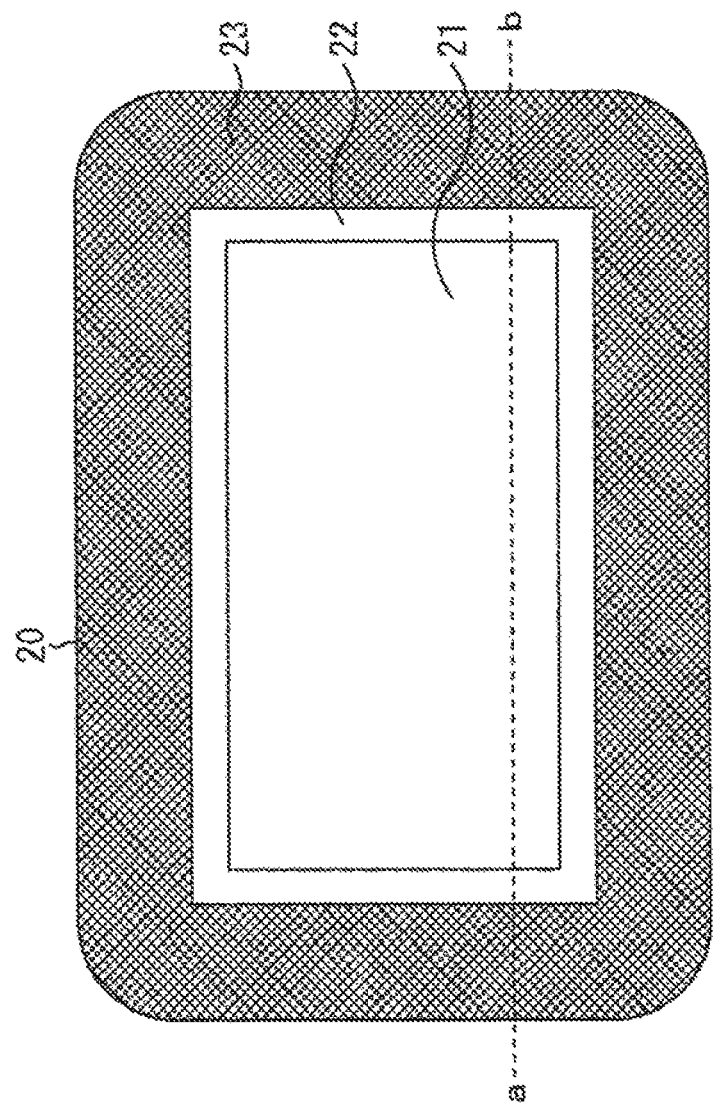

SOLID-STATE IMAGING ELEMENT, AND ELECTRONIC DEVICE

CROSS REFERENCE TO RELATED APPLICATIONS

This application is a U.S. National Phase of International Patent Application No. PCT/JP2015/067229 filed on Jun. 16, 2015, which claims priority benefit of Japanese Patent Application No. JP 2014-132762 filed in the Japan Patent Office on Jun. 27, 2014. Each of the above-referenced applications is hereby incorporated herein by reference in its entirety.

TECHNICAL FIELD

The present disclosure relates to a solid-state imaging element and an electronic device, and particularly relates to a solid-state imaging element configured to inhibit inconvenience, which is attributable to the shape of a light shielding film formed for disposing an optical black (OPB) region, caused during the formation of a color filter, an on-chip lens, and the like to be arranged on the upper layer side of the light shielding film, and an electronic device.

BACKGROUND ART

FIG. 1 and FIG. 2 illustrate an example of a conventional configuration of a solid-state imaging element represented by the CMOS. FIG. 1 is a top view, and FIG. 2 is a cross-sectional view along line a-b in FIG. 1.

A large number of pixels are arranged on the whole surface of the solid-state imaging element 10. The major portion thereof is defined as an effective pixel region 11, and an OPB region 12 is arranged around the effective pixel region 11 for, for example, setting a black level. The OPB region 12 is achieved by coating the upper surface of pixels positioned around the effective pixel region 11 with a light shielding film 13.

However, when the OPB region 12 is achieved by simply coating the upper surface of the pixels positioned around the effective pixel region 11 with the light shielding film 13, a step is generated, as illustrated in FIG. 2, by the height of the light shielding film 13 at a boundary between the effective pixel region 11 and the OPB region 12. Then, this step has an adverse effect on a process of forming a color filter, an on-chip lens, and the like (any of these is not illustrated) to be disposed on the upper layer side of the light shielding film 13.

Specifically, in some cases, a color filter, an on-chip lens, and the like were tilted, and the thickness and shape of the film came to be non-uniform. Accordingly, color properties were varied, causing generation of unevenness in sensitivity and color.

It is noted that especially in a back-surface irradiation type CMOS among the solid-state imaging elements, a product into which a color filter is embedded is expected to be developed. In this product, the omission of a base layer which has been formed for the purpose of elimination of the step of the light shielding film is under consideration for saving the cost. In that case, the effect by the step of the light shielding film 13 may become apparent.

To overcome such a problem which is attributable to the step of the light shielding film 13, there has been conventionally proposed, for example, as illustrated in a cross-sectional view of FIG. 3, a method of inhibiting the effect by the step by forming the light shielding film 13 in a tilted or stepwise manner (not illustrated), or by thinning the light shielding film 13 itself (for example, see Patent Literature 1).

CITATION LIST

Patent Literature

Patent Literature 1: JP 2012-49295A

SUMMARY OF INVENTION

Technical Problem

As described above, the light shielding film formed for disposing the OPB region can have an adverse effect on the formation of a constituent arranged on the upper layer side of the light shielding film in the solid-state imaging element. Therefore, the shape of the light shielding film needs to be further examined.

The present disclosure has been achieved in view of such circumstances, and intends to inhibit an adverse effect on the formation of a constituent arranged on the upper layer side of the light shielding film, which is attributable to the light-shielding film formed for disposing the OPB region to the solid-state imaging element.

Solution to Problem

According to a first aspect of the present disclosure, there is provided a solid-state imaging element, including: an effective pixel region in which a large number of pixels are vertically and horizontally arranged; and an OPB region formed by coating pixels around the effective pixel region with a light shielding film. Corners on at least one of an outer circumferential side and an inner circumferential side of the OPB region are formed into an arc shape.

Corners on at least one of an outer circumferential side and an inner circumferential side of the OPB region can be formed into an arc shape with a curvature radius of 100 μm or more.

Corners on an outer circumferential side of the OPB region can be formed into an arc shape.

The solid-state imaging element can be of a back-surface irradiation type.

The solid-state imaging element can be of a front-surface irradiation type.

The light shielding film can have a constant height.

The light shielding film can have a height that is tilted or stepwise in such a manner as to increase from an inner circumferential side toward an outer circumferential side.

The light shielding film can have a height that is tilted or stepwise in such a manner as to increase from an outer circumferential side toward an inner circumferential side.

According to a second aspect of the present disclosure, there is provided an electronic device equipped with a solid-state imaging element, the solid-state imaging element including an effective pixel region in which a large number of pixels are vertically and horizontally arranged, and an OPB region formed by coating pixels around the effective pixel region with a light shielding film. Corners on at least one of an outer circumferential side and an inner circumferential side of the OPB region are formed into an arc shape.

Advantageous Effects of Invention

According to the first and second aspects of the present disclosure, there can be inhibited an adverse effect on the formation of a constituent arranged on the upper layer side of the light shielding film, which is attributable to the light-shielding film formed for disposing the OPB region to the solid-state imaging element.

BRIEF DESCRIPTION OF DRAWINGS

FIG. 4 is a top view of a first configuration example of a solid-state imaging element to which the present disclosure is applied.

DESCRIPTION OF EMBODIMENT(S)

Hereinafter, a best mode (hereinafter, referred to as an embodiment) for carrying out the present disclosure will be described in detail with reference to the drawings.

Configuration Example of Solid-State Imaging Element of the Embodiment

Figure 5A:
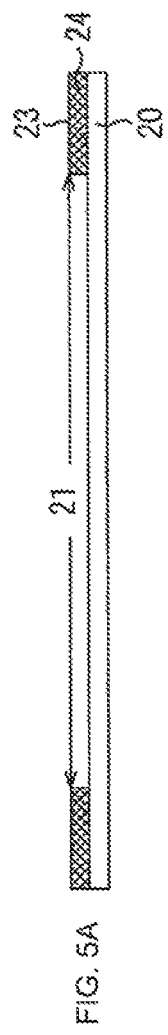
FIGS. 5A, 5B, and 5C are a cross-sectional view corresponding to the solid-state imaging element of FIG. 4.
Figure 5B:
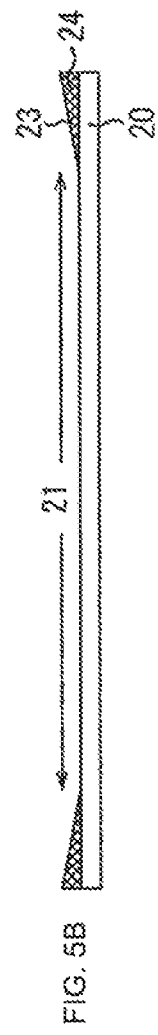
Figure 5C:
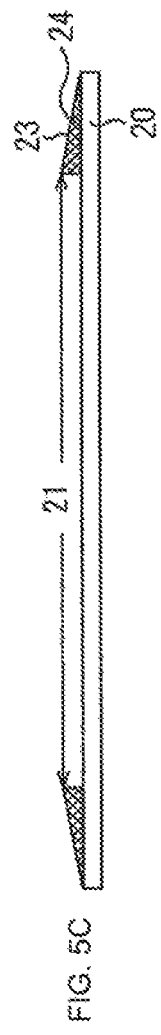

FIG. 4 is a top view illustrating a configuration example (first configuration example) of a solid-state imaging element 20. FIGS. 5A, 5B, and 5C illustrates cross-sectional views along line a-b of the first configuration example illustrated in FIG. 4.

Figure 1:
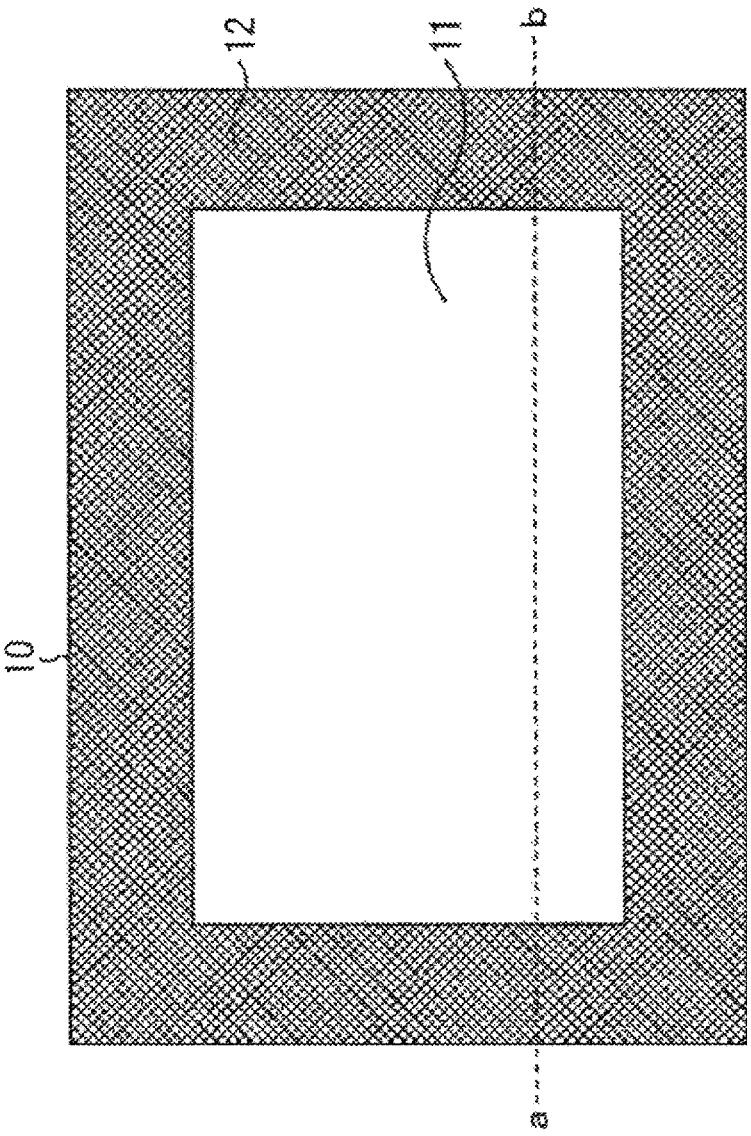
FIG. 1 is a top view illustrating an example of a configuration of a conventional solid-state imaging element.
Figure 2:
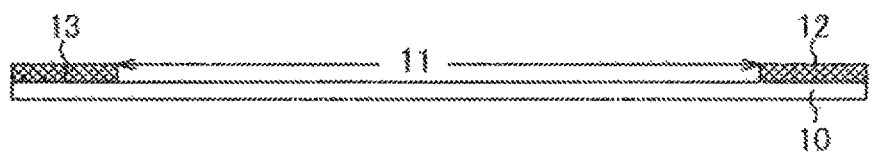
FIG. 2 is a cross-sectional view corresponding to the solid-state imaging element of FIG. 1.
Figure 3:
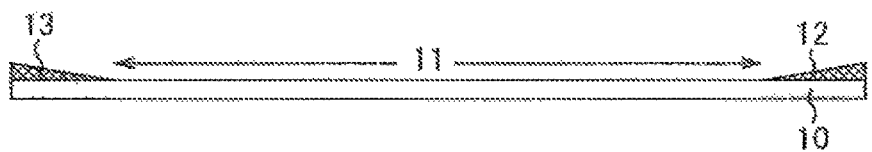
FIG. 3 is a cross-sectional view of a solid-state imaging element including a tilted light shielding film.

In the first configuration example of the solid-state imaging element 20 illustrated in FIG. 4, a large number of pixels are arranged on the whole surface in a similar manner to the conventional solid-state imaging element 10 illustrated in FIG. 1. The major portion thereof is defined as an effective pixel region 21, and an OPB region 23 to be disposed for, for example, setting a black level is arranged around the effective pixel region 21 with a dummy region 22 placed therebetween. The OPB region 23 is achieved by coating the upper surface of pixels positioned around the dummy region 22 with a light shielding film 24.

It is noted that the cross-section of the light shielding film 24 may be such that the height of a step is constant from the inner circumferential side to the outer circumferential side, as illustrated in FIG. 5A. Also, the step may be tilted (or stepwise) in such a manner as to become higher from the inner circumferential side toward the outer circumferential side, as illustrated in FIG. 5B. Conversely, the step may be tilted (or stepwise) in such a manner as to become higher from the outer circumferential side toward the inner circumferential side, as illustrated in FIG. 5C.

The difference between the conventional solid-state imaging element 10 illustrated in FIG. 1 and the first configuration example of the solid-state imaging element 20 is that the shape of four corners on the outer circumferential side of the OPB region 23 is rounded into an arc shape. It is noted that the curvature judgment of the rounded four corners is, for example, 100 μm (micrometer) or more, and 200 μm or more is preferably recommended.

The formation of rounded arc-shaped four corners on the outer circumferential side of the OPB region 23 reduces generation of brushing unevenness during the manufacture of the solid-state imaging element 20, which is attributable to the step of the light shielding film 24. This can inhibit a color filter, an on-chip lens, and the like disposed on the upper layer side of the light shielding film 24 from having a non-uniform shape.

It is noted that the four corners on the outer circumferential side of the OPB region 23 can be rounded merely by changing the layout of the light shielding region, without adding a new process to the manufacturing process of the conventional solid-state imaging element 10.

Other Configuration Example of Solid-State Imaging Element of the Embodiment

Figure 6:
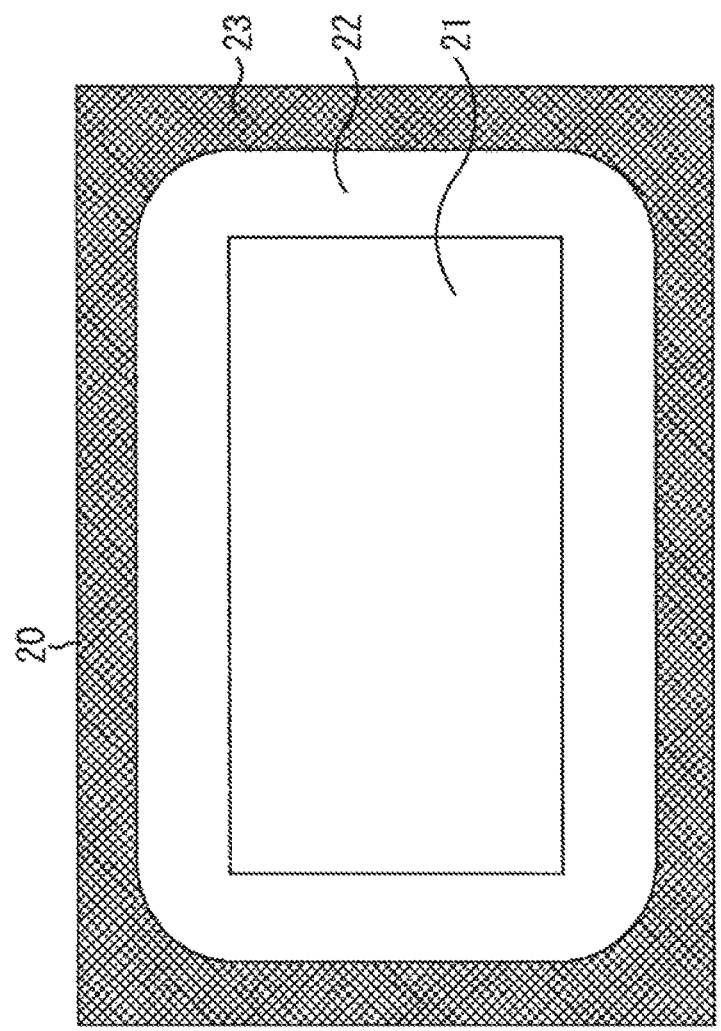
FIG. 6 is a top view of a second configuration example of a solid-state imaging element to which the present disclosure is applied.

Next, FIG. 6 is a top view illustrating another configuration example (second configuration example) of the solid-state imaging element 20 according to an embodiment of the present disclosure. It is noted that the cross-sectional view of the second configuration example of the solid-state imaging element 20 is similar to the cross-sectional view illustrated in FIGS. 5A, 5B, and 5C, and therefore is not illustrated.

In the second configuration example of the solid-state imaging element 20 illustrated in FIG. 6, a large number of pixels are arranged on the whole surface in a similar manner to the conventional solid-state imaging element 10 illustrated in FIG. 1. The major portion thereof is defined as an effective pixel region 21, and an OPB region 23 to be disposed for, for example, setting a black level is arranged around the effective pixel region 21 with a dummy region 22 placed therebetween. The OPB region 23 is achieved by coating the upper surface of pixels positioned around the dummy region 22 with a light shielding film 24.

The difference between the conventional solid-state imaging element 10 illustrated in FIG. 1 and the second configuration example of the solid-state imaging element 20 is that the shape of four corners on the inner circumferential side of the OPB region 23 is rounded into an arc shape. It is noted that the curvature judgment of the rounded four corners is, for example, 100 μm (micrometer) or more, and 200 μm or more is preferably recommended.

The formation of rounded arc-shaped four corners on the inner circumferential side of the OPB region 23 reduces generation of brushing unevenness during the manufacture of the solid-state imaging element 20, which is attributable to the step of the light shielding film 24. This can inhibit a color filter, an on-chip lens, and the like disposed on the upper layer side of the light shielding film 24 from having a non-uniform shape.

It is noted that the four corners on the inner circumferential side of the OPB region 23 can be rounded merely by changing the layout of the light shielding region, without adding a new process to the manufacturing process of the conventional solid-state imaging element 10.

Figure 7:
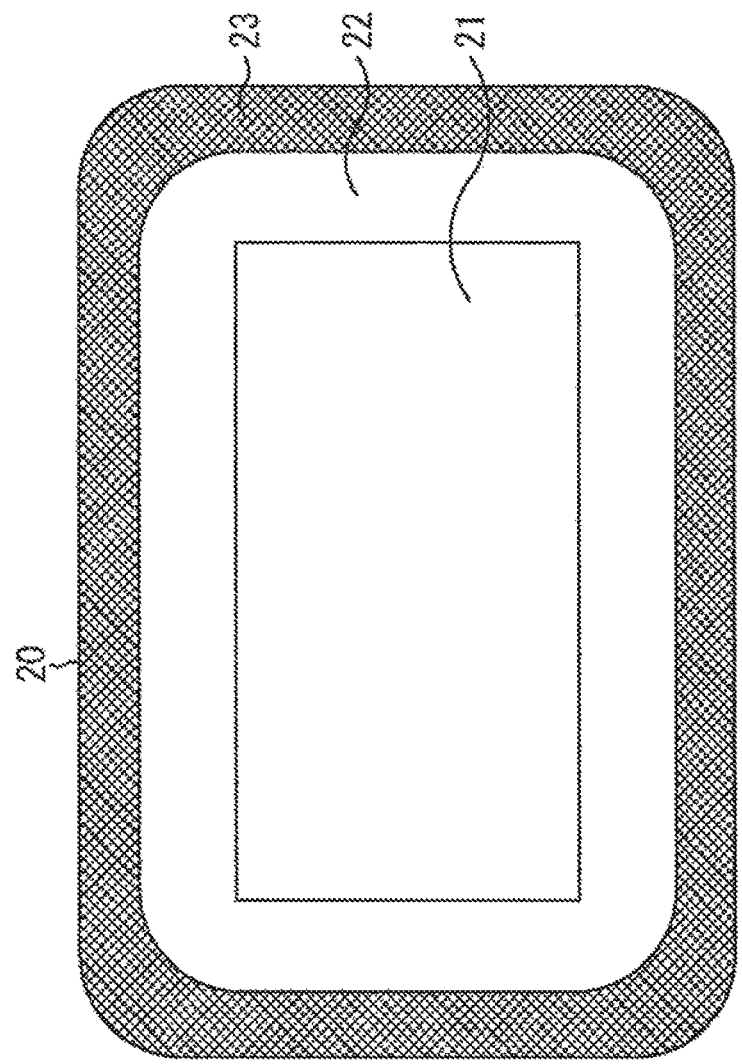
FIG. 7 is a top view of a third configuration example of a solid-state imaging element to which the present disclosure is applied.

Next, FIG. 7 is a top view illustrating further another configuration example (third configuration example) of the solid-state imaging element 20 according to an embodiment of the present disclosure. It is noted that the cross-sectional view of the third configuration example of the solid-state imaging element 20 is similar to the cross-sectional view illustrated in FIGS. 5A, 5B, and 5C, and therefore is not illustrated.

In the third configuration example of the solid-state imaging element 20 illustrated in FIG. 7, a large number of pixels are arranged on the whole surface in a similar manner to the conventional solid-state imaging element 10 illustrated in FIG. 1. The major portion thereof is defined as an effective pixel region 21, and an OPB region 23 to be disposed for, for example, setting a black level is arranged around the effective pixel region 21 with a dummy region 22 placed therebetween. The OPB region 23 is achieved by coating the upper surface of pixels positioned around the dummy region 22 with a light shielding film 24.

The difference between the conventional solid-state imaging element 10 illustrated in FIG. 1 and the third configuration example of the solid-state imaging element 20 is that the shape of four corners on each of the inner and outer circumferential sides of the OPB region 23 is rounded. It is noted that the curvature judgment of the rounded four corners is, for example, 100 μm (micrometer) or more, and 200 μm or more is preferably recommended.

The formation of rounded four corners on both the inner and outer circumferential sides of the OPB region 23 reduces generation of brushing unevenness during the manufacture of the solid-state imaging element 20, which is attributable to the step of the light shielding film 24. This can inhibit a color filter, an on-chip lens, and the like disposed on the upper layer side of the light shielding film 24 from having a non-uniform shape.

It is noted that the four corners on both the inner and outer circumferential sides of the OPB region 23 can be formed into an arc shape merely by changing the layout of the light shielding region, without adding a new process to the manufacturing process of the conventional solid-state imaging element 10.

The above-described first to third configuration examples of the solid-state imaging element 20 can be applied to both the back-surface irradiation type and front-surface irradiation type solid-state imaging elements.

Also, the present disclosure can be applied to all types of electronic devices, other than the imaging device to be equipped with the solid-state imaging element 20.

It is noted that an embodiment of the present disclosure is not limited to the above-described embodiments, and various modifications are possible within the range not departing from the gist of the present disclosure.

Additionally, the present technology may also be configured as below.

(1)

A solid-state imaging element, including:

an effective pixel region in which a large number of pixels are vertically and horizontally arranged; and an OPB region formed by coating pixels around the effective pixel region with a light shielding film, wherein corners on at least one of an outer circumferential side and an inner circumferential side of the OPB region are formed into an arc shape.

(2)

The solid-state imaging element according to (1), wherein corners on at least one of an outer circumferential side and an inner circumferential side of the OPB region are formed into an arc shape with a curvature radius of 100 μm or more.

(3)

The solid-state imaging element according to (1) or (2), wherein corners on an outer circumferential side of the OPB region are formed into an arc shape.

(4)

The solid-state imaging element according to any of (1) to (3), wherein the solid-state imaging element is of a back-surface irradiation type.

(5)

The solid-state imaging element according to any of (1) to (3), wherein the solid-state imaging element is of a front-surface irradiation type.

(6)

The solid-state imaging element according to any of (1) to (5), wherein the light shielding film has a constant height.

(7)

The solid-state imaging element according to any of (1) to (5), wherein the light shielding film has a height that is tilted or stepwise in such a manner as to increase from an inner circumferential side toward an outer circumferential side.

(8)

The solid-state imaging element according to any of (1) to (5), wherein the light shielding film has a height that is tilted or stepwise in such a manner as to increase from an outer circumferential side toward an inner circumferential side.

(9)

An electronic device equipped with a solid-state imaging element, the solid-state imaging element including an effective pixel region in which a large number of pixels are vertically and horizontally arranged, and an OPB region formed by coating pixels around the effective pixel region with a light shielding film, wherein corners on at least one of an outer circumferential side and an inner circumferential side of the OPB region are formed into an arc shape.

REFERENCE SIGNS LIST 20 solid-state imaging element
21 effective pixel region
22 dummy region
23 OPB region
24 light shielding film

The invention claimed is:

1. A solid-state imaging element, comprising:
an effective pixel region comprising a plurality of first pixels arranged in rows and columns;
an optical black (OPB) region comprising a plurality of second pixels; and
a light shielding film on the plurality of second pixels, wherein
the OPB region is around the effective pixel region,
at least one corner of a first plurality of corners of an outer circumferential side of the OPB region is of an arc shape,
an inner circumferential side of the OPB region is at a specific distance from the outer circumferential side of the OPB region in a first direction,
the first direction is parallel to an upper surface of the second plurality of pixels,
the light shielding film is tilted with respect to the OPB region,
a height of the light shielding film increases from the outer circumferential side towards the inner circumferential side for entire width of the light shielding film, the width of the light shielding film is in the first direction, and the height of the light shielding film is in a second direction perpendicular to the first direction.

2. The solid-state imaging element according to claim 1, wherein a curvature radius of each of the at least one corner of the first plurality of corners is at least 100 μm.

3. The solid-state imaging element according to claim 1, wherein each of the first plurality of corners on the outer circumferential side of the OPB region is of the arc shape.

4. The solid-state imaging element according to claim 1, wherein the solid-state imaging element is of a back-surface irradiation type.

5. The solid-state imaging element according to claim 1, wherein the solid-state imaging element is of a front-surface irradiation type.

6. The solid-state imaging element according to claim 3, wherein each of a second plurality of corners of the inner circumferential side of the OPB region is of a shape different from the arc shape.

7. The solid-state imaging element according to claim 1, wherein each of the first plurality of corners of the outer circumferential side of the OPB region and each of a second plurality of corners of the inner circumferential side of the OPB region are of the arc shape.

8. An electronic device, comprising:

a solid-state imaging element, wherein the solid-state imaging element includes:

an effective pixel region comprising a plurality of first pixels arranged in rows and columns;

an optical black (OPB) region comprising a plurality of second pixels; and a light shielding film on the plurality of second pixels, wherein the OPB region is around the effective pixel region, at least one corner of a plurality of corners of an outer circumferential side of the OPB region is of an arc shape, an inner circumferential side of the OPB region is at a specific distance from the outer circumferential side of the OPB region in a first direction, the first direction is parallel to an upper surface of the second plurality of pixels, the light shielding film is tilted with respect to the OPB region, a height of the light shielding film increases from the outer circumferential side towards the inner circumferential side for entire width of the light shielding film, the width of the light shielding film is in the first direction, and the height of the light shielding film is in a second direction perpendicular to the first direction.

* * * * *